United States Patent
Bae et al.

(10) Patent No.: US 11,698,587 B2
(45) Date of Patent: Jul. 11, 2023

(54) RESIST UNDERLAYER COMPOSITION, AND METHOD OF FORMING PATTERNS USING THE COMPOSITION

(71) Applicant: SAMSUNG SDI CO., LTD., Yongin-si (KR)

(72) Inventors: Shinhyo Bae, Suwon-si (KR); Soonhyung Kwon, Suwon-si (KR); Hyeon Park, Suwon-si (KR); Jaeyeol Baek, Suwon-si (KR); Beomjun Joo, Suwon-si (KR); Yoojeong Choi, Suwon-si (KR)

(73) Assignee: SAMSUNG SDI CO., LTD., Yongin-si (KR)

(*) Notice: Subject to any disclaimer, the term of this patent is extended or adjusted under 35 U.S.C. 154(b) by 1009 days.

(21) Appl. No.: 16/436,140

(22) Filed: Jun. 10, 2019

(65) Prior Publication Data
US 2019/0377262 A1    Dec. 12, 2019

(30) Foreign Application Priority Data

Jun. 11, 2018    (KR) ........................ 10-2018-0066832

(51) Int. Cl.
| | | |
|---|---|---|
| *G03F 7/09* | (2006.01) | |
| *G03F 7/11* | (2006.01) | |
| *C08G 18/02* | (2006.01) | |
| *C08L 71/00* | (2006.01) | |
| *G03F 7/36* | (2006.01) | |

(Continued)

(52) U.S. Cl.
CPC ........... *G03F 7/091* (2013.01); *C08G 18/022* (2013.01); *C08L 61/06* (2013.01); *C08L 61/28* (2013.01); *C08L 63/00* (2013.01); *C08L 71/00* (2013.01); *C08L 75/04* (2013.01); *G03F 7/0041* (2013.01); *G03F 7/0045* (2013.01); *G03F 7/094* (2013.01); *G03F 7/36* (2013.01)

(58) Field of Classification Search
CPC ... G03F 7/091; G03F 7/11; G03F 7/36; C08G 18/02; C08L 71/00
See application file for complete search history.

(56) References Cited

U.S. PATENT DOCUMENTS

| | | |
|---|---|---|
| 6,414,146 B1 | 7/2002 | Takeyama et al. |
| 2012/0077124 A1 | 3/2012 | Nakahara et al. |
| | (Continued) | |

FOREIGN PATENT DOCUMENTS

| | | |
|---|---|---|
| CN | 103183974 A | 7/2013 |
| CN | 105229532 A | 1/2016 |
| | (Continued) | |

OTHER PUBLICATIONS

A Widely Applicable New Additive For Synthetic Materials, Jul. 1, 1988, China Academic Journal Electronic Publishing House. 1994-2019.

(Continued)

*Primary Examiner* — John S Chu
(74) *Attorney, Agent, or Firm* — Lee IP Law, P.C.

(57) ABSTRACT

A resist underlayer composition and a method of forming patterns using a resist underlayer composition, the resist underlayer composition including a polymer, the polymer including a structural unit that is a reaction product of an isocyanurate compound, the isocyanurate compound having at least one thiol group thereon, and a solvent.

11 Claims, 5 Drawing Sheets

(51) Int. Cl.
  *G03F 7/004*    (2006.01)
  *C08L 75/04*    (2006.01)
  *C08L 61/06*    (2006.01)
  *C08L 63/00*    (2006.01)
  *C08L 61/28*    (2006.01)

(56) References Cited

U.S. PATENT DOCUMENTS

| | | | |
|---|---|---|---|
| 2012/0164338 A1 | 6/2012 | Roh et al. | |
| 2014/0131618 A1* | 5/2014 | Matson | C09J 181/04 |
| | | | 252/182.3 |
| 2016/0040051 A1* | 2/2016 | Matson | C09D 7/63 |
| | | | 528/376 |

FOREIGN PATENT DOCUMENTS

| | | |
|---|---|---|
| JP | 3804792 B2 | 8/2006 |
| JP | 2011-527460 A | 10/2011 |
| JP | 2011-527461 A | 10/2011 |
| JP | 5041175 B2 | 10/2012 |
| JP | 2013-032327 A | 2/2013 |
| JP | 2013-140337 A | 7/2013 |
| JP | 2014-102285 A | 6/2014 |
| JP | 5741860 B2 | 7/2015 |
| JP | 2015-147907 A | 8/2015 |
| JP | 2015-178479 A | 10/2015 |
| JP | 2016-185999 A | 10/2016 |
| JP | 6037137 B2 | 11/2016 |
| JP | 6057099 B2 | 1/2017 |
| JP | WO 2015/098525 A1 | 3/2017 |
| JP | 2017-116803 A | 6/2017 |
| JP | 2018-013768 A | 1/2018 |
| KR | 10-2005-0080223 A | 8/2005 |
| KR | 10-2013-0077427 A | 7/2013 |
| KR | 10-1566532 B1 | 10/2015 |
| KR | 10-1573873 B1 | 11/2015 |
| KR | 10-2017-0010610 A | 2/2017 |
| TW | 201714913 A | 5/2017 |
| WO | WO 2005-088398 A1 | 9/2005 |
| WO | WO 2006-040918 A1 | 4/2006 |
| WO | WO 2013/100411 A1 | 7/2013 |
| WO | WO 2013-118879 A1 | 8/2013 |

OTHER PUBLICATIONS

Chinese Officat action and Search Report dated Aug. 31, 2022.

* cited by examiner

RESIST UNDERLAYER COMPOSITION, AND METHOD OF FORMING PATTERNS USING THE COMPOSITION

CROSS-REFERENCE TO RELATED APPLICATION

Korean Patent Application No. 10-2018-0066832, filed on Jun. 11, 2018, in the Korean Intellectual Property Office, and entitled: "Resist Underlayer Composition, and Method of Forming Patterns Using the Composition," is incorporated by reference herein in its entirety.

BACKGROUND

1. Field

Embodiments relate to a resist underlayer composition and a method of forming patterns using the same.

2. Description of the Related Art

Recently, the semiconductor industry has developed to an ultra-fine technique having a pattern of several to several tens of nanometer size. Such ultrafine technique may utilize effective lithographic techniques.

SUMMARY

The embodiments may be realized by providing a resist underlayer composition including a polymer including a structural unit that is a reaction product of an isocyanurate compound, the isocyanurate compound having at least one thiol group, and a solvent.

The isocyanurate compound may be represented by Chemical Formula 1:

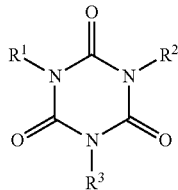

[Chemical Formula 1]

wherein, in Chemical Formula 1, $R^1$ to $R^3$ may each independently be a substituted or unsubstituted C1 to C30 alkyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C6 to C30 aryl group, or a substituted or unsubstituted C1 to C30 heteroaryl group, provided that at least one of $R^1$ to $R^3$ includes a thiol group substituent.

The isocyanurate compound may be represented by Chemical Formula 1-1:

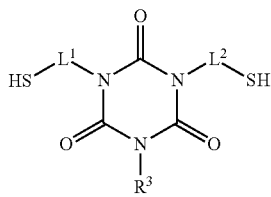

[Chemical Formula 1-1]

wherein, in Chemical Formula 1-1 $L^1$ and $L^2$ may each independently be a substituted or unsubstituted C1 to C10 alkylene group, a substituted or unsubstituted C1 to C10 heteroalkylene group, a substituted or unsubstituted C3 to C10 cycloalkylene group, a substituted or unsubstituted C2 to C10 heterocycloalkylene group, a substituted or unsubstituted C6 to C10 arylene group, or a substituted or unsubstituted C1 to C10 heteroarylene group, and $R^3$ may be a substituted or unsubstituted C1 to C10 alkyl group, a substituted or unsubstituted C1 to C10 heteroalkyl group, a substituted or unsubstituted C3 to C10 cycloalkyl group, a substituted or unsubstituted C2 to C10 heterocycloalkyl group, a substituted or unsubstituted C6 to C10 aryl group, or a substituted or unsubstituted C1 to C10 heteroaryl group.

The structural unit may be a reaction product of the isocyanurate compound and a compound having at least one reactive functional group.

The structural unit may be a reaction product of the thiol group of the isocyanurate compound and the at least one reactive functional group of the compound including the at least one reactive functional group.

The compound including at least one reactive functional group may be represented by Chemical Formula 2:

$A^1$-D-$A^2$ [Chemical Formula 2]

wherein, in Chemical Formula 2, $A^1$ and $A^2$ may each independently be a substituted or unsubstituted C1 to C10 alkoxide group, a substituted or unsubstituted C2 to C10 alkenyl group, a substituted or unsubstituted C2 to C10 alkynyl group, a substituted or unsubstituted C1 to C10 carbonate group, —C(=O)$R^a$, or —C(=O)O$R^b$, in which $R^a$ and $R^b$ are each independently hydrogen or a halogen atom, and D may be a substituted or unsubstituted C1 to C30 alkylene group, a substituted or unsubstituted C1 to C30 heteroalkylene group, a substituted or unsubstituted C3 to C30 cycloalkylene group, a substituted or unsubstituted C2 to C30 heterocycloalkylene group, a substituted or unsubstituted C6 to C30 arylene group, or a substituted or unsubstituted C1 to C30 heteroarylene group.

The compound represented by Chemical Formula 2 may be a compound represented by one of the following Chemical Formula 2-1 to Chemical Formula 2-4:

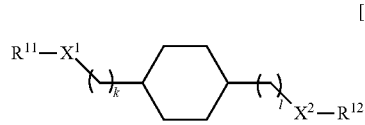

[Chemical Formula 2-1]

[Chemical Formula 2-2]

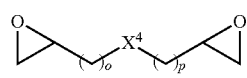

[Chemical Formula 2-3]

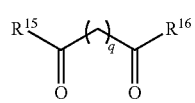

[Chemical Formula 2-4]

wherein, in Chemical Formulae 2-1 to 2-4, $X^1$ to $X^4$ may each independently be $CH_2$, O, or S, $R^{11}$ to $R^{14}$ may each independently be a substituted or unsubstituted C1 to C6 alkenyl group, $R^{15}$ and $R^{16}$ may each independently be hydrogen or a halogen atom, and k, l, m, n, o, p, and q may each independently be an integer of 0 to 10.

The structural unit of the polymer may be represented by one of the following Chemical Formula 3 to Chemical Formula 6:

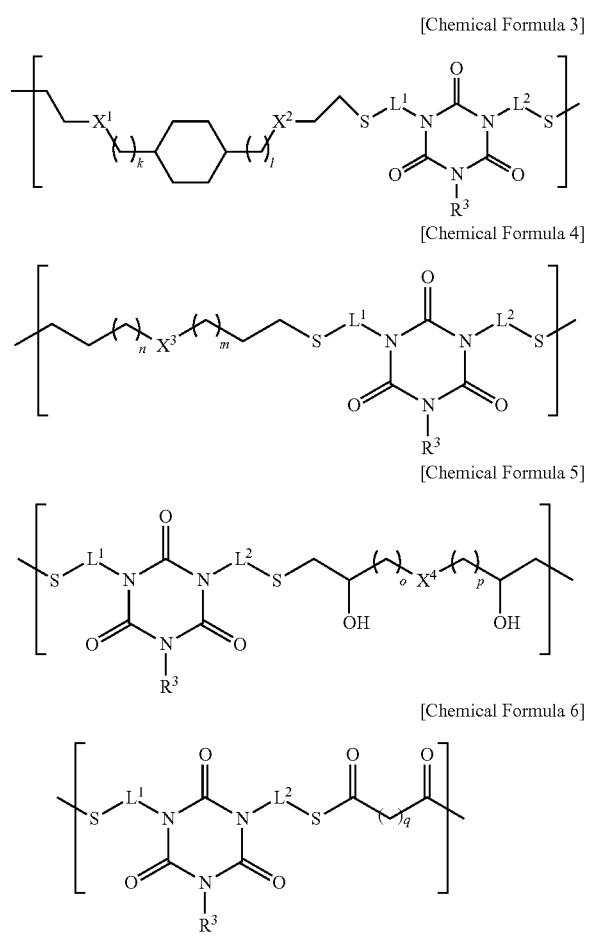

[Chemical Formula 3]

[Chemical Formula 4]

[Chemical Formula 5]

[Chemical Formula 6]

wherein, in Chemical Formula 3 to Chemical Formula 6, $X^1$ to $X^4$ may each independently be $CH_2$, O, or S, $L^1$ and $L^2$ may each independently be a substituted or unsubstituted C1 to C10 alkylene group, a substituted or unsubstituted C1 to C10 heteroalkylene group, a substituted or unsubstituted C3 to C10 cycloalkylene group, a substituted or unsubstituted C2 to C10 heterocycloalkylene group, a substituted or unsubstituted C6 to C10 arylene group, or a substituted or unsubstituted C1 to C10 heteroarylene group, $R^3$ may be a substituted or unsubstituted C1 to C10 alkyl group, a substituted or unsubstituted C1 to C10 heteroalkyl group, a substituted or unsubstituted C3 to C10 cycloalkyl group, a substituted or unsubstituted C2 to C10 heterocycloalkyl group, a substituted or unsubstituted C6 to C10 aryl group, or a substituted or unsubstituted C1 to C10 heteroaryl group, and k, l, m, n, o, p, and q may each independently be an integer of 0 to 10.

The polymer may have a weight average molecular weight of about 1,000 to about 100,000.

The polymer may be included in the composition in an amount of about 0.1 wt % to about 30 wt %, based on a total weight of the resist underlayer composition.

The resist underlayer composition may further include an additional polymer, the additional polymer including an acryl resin, an epoxy resin, a novolac resin, a glycoluril resin, or a melamine resin.

The resist underlayer composition may further include a surfactant, thermal acid generator, a plasticizer, or a combination thereof.

The embodiments may be realized by providing a method of forming patterns, the method including forming an etching subject layer on a substrate, coating the resist underlayer composition according to an embodiment on the etching subject layer to form a resist underlayer, forming a photoresist pattern on the resist underlayer, and sequentially etching the resist underlayer and the etching subject layer using the photoresist pattern as an etching mask.

Forming the photoresist pattern may include forming a photoresist layer on the resist underlayer, exposing the photoresist layer, and developing the photoresist layer.

Forming the resist underlayer may further include heat-treating the coated resist underlayer composition at a temperature of about 100° C. to about 500° C.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
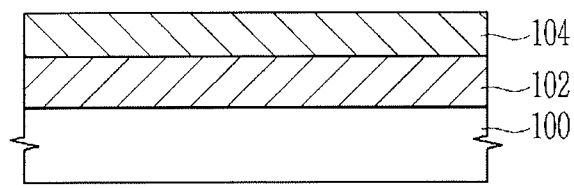
FIGS. 1 to 5 illustrate cross-sectional views of stages in a method of forming patterns using a resist underlayer composition according to an embodiment.

Example embodiments of the present disclosure will hereinafter be described in detail, and may be easily performed by a person skilled in the art. However, this disclosure may be embodied in many different forms and is not construed as limited to the example embodiments set forth herein.

In the drawings, the thickness of layers, films, panels, regions, etc., may be exaggerated for clarity and like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, 'substituted' refers to replacement of a hydrogen atom of a compound by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a vinyl group, a C1 to C20 alkyl group, a C2 to C20 alkenyl group, a C2 to C20 alkynyl group, a C6 to C30 aryl group, a C7 to C30 arylalkyl group, a C6 to C30 allyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, the term 'hetero' refers to one including 1 to 3 heteroatoms selected from N, O, S, and P.

Hereinafter, a resist underlayer composition according to an embodiment is described.

A resist underlayer composition according to an embodiment may include a polymer and a solvent. The polymer may include a structural unit that is a reaction product of or derived from an isocyanurate compound or derivative thereof. The isocyanurate compound may include at least one thiol group (—SH), e.g., at a terminal end as a pendent thiol group. The thiol group (—SH) may be a functional group that acts as a linking site during a polymerization reaction for forming the polymer.

In an implementation, the thiol group (—SH) of the isocyanurate compound may be bound to other compounds (e.g., during formation of the polymer) or may act as a linking site for a polymerization of isocyanurate compounds (e.g., homopolymerization of the isocyanurate compounds).

In an implementation, the isocyanurate compound may be represented by Chemical Formula 1.

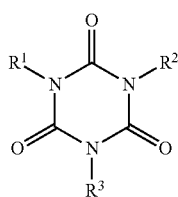

[Chemical Formula 1]

In Chemical Formula 1, $R^1$ to $R^3$ may each independently be or include, e.g., a substituted or unsubstituted C1 to C30 alkyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C6 to C30 aryl group, or a substituted or unsubstituted C1 to C30 heteroaryl group. In an implementation, at least one of $R^1$ to $R^3$ may have a thiol group (—SH) as a substituent, e.g., to provide the pendent thiol group on the isocyanurate compound.

In an implementation, the isocyanurate compound may be represented by Chemical Formula 1-1.

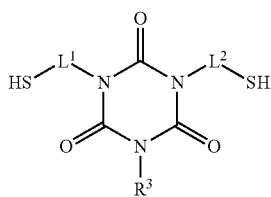

[Chemical Formula 1-1]

In Chemical Formula 1-1, $L^1$ and $L^2$ may each independently be or include, e.g., a substituted or unsubstituted C1 to C10 alkylene group, a substituted or unsubstituted C1 to C10 heteroalkylene group, a substituted or unsubstituted C3 to C10 cycloalkylene group, a substituted or unsubstituted C2 to C10 heterocycloalkylene group, a substituted or unsubstituted C6 to C10 arylene group, or a substituted or unsubstituted C1 to C10 heteroarylene group, and $R^3$ may be or may include, e.g., a substituted or unsubstituted C1 to C10 alkyl group, a substituted or unsubstituted C1 to C10 heteroalkyl group, a substituted or unsubstituted C3 to C10 cycloalkyl group, a substituted or unsubstituted C2 to C10 heterocycloalkyl group, a substituted or unsubstituted C6 to C10 aryl group, or a substituted or unsubstituted C1 to C10 heteroaryl group.

In an implementation, the structural unit of the polymer may be provided by a reaction of the isocyanurate compound and a compound having at least one reactive functional group, e.g., at a terminal end thereof.

In an implementation, the structural unit of the polymer may be provided by a reaction of the thiol group (—SH) of the isocyanurate compound and a reactive functional group of the compound including the at least one reactive functional group.

In an implementation, the compound including the at least one reactive functional group may be represented by Chemical Formula 2.

$A^1$-D-$A^2$  [Chemical Formula 2]

In Chemical Formula 2.

$A^1$ and $A^2$ may each independently be or include, e.g., a substituted or unsubstituted C1 to C10 alkoxide group, a substituted or unsubstituted C2 to C10 alkenyl group, a substituted or unsubstituted C2 to C10 alkynyl group, a substituted or unsubstituted C1 to C10 carbonate group, —C(=O)$R^a$, or —C(=O)O$R^b$, (in which $R^a$ and $R^b$ are each independently hydrogen or a halogen atom), and D may be or may include, e.g., a substituted or unsubstituted C1 to C30 alkylene group, a substituted or unsubstituted C1 to C30 heteroalkylene group, a substituted or unsubstituted C3 to C30 cycloalkylene group, a substituted or unsubstituted C2 to C30 heterocycloalkylene group, a substituted or unsubstituted C6 to C30 arylene group, or a substituted or unsubstituted C1 to C30 heteroarylene group.

In an implementation, the compound represented by Chemical Formula 2 may be represented by one of the following Chemical Formula 2-1 to Chemical Formula 2-4.

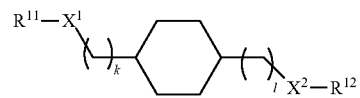

[Chemical Formula 2-1]

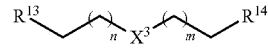

[Chemical Formula 2-2]

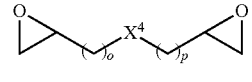

[Chemical Formula 2-3]

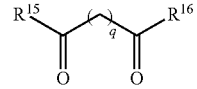

[Chemical Formula 2-4]

In Chemical Formulae 2-1 to 2-4, $X^1$ to $X^4$ may each independently be, e.g., $CH_2$, O, or S, $R^{11}$ to $R^{14}$ may each independently be, e.g., a substituted or unsubstituted C1 to C6 alkenyl group, $R^{15}$ and $R^{16}$ may each independently be, e.g., hydrogen or a halogen atom, and k, l, m, n, o, p, and q may each independently be, e.g., an integer of 0 to 10.

The structural unit of the polymer may be represented by one of the following Chemical Formula 3 to Chemical Formula 6.

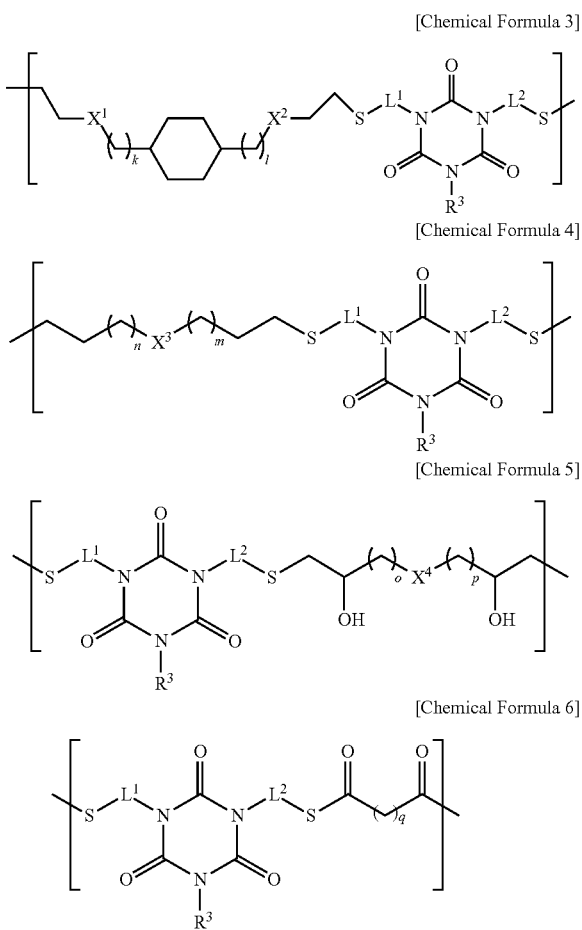

[Chemical Formula 3]

[Chemical Formula 4]

[Chemical Formula 5]

[Chemical Formula 6]

In Chemical Formula 3 to Chemical Formula 6, $X^1$ to $X^4$ may each independently be, e.g., $CH_2$, O, or S, $L^1$ and $L^2$ may each independently be or include, e.g., a substituted or unsubstituted C1 to C10 alkylene group, a substituted or unsubstituted C1 to C10 heteroalkylene group, a substituted or unsubstituted C3 to C10 cycloalkylene group, a substituted or unsubstituted C2 to C10 heterocycloalkylene group, a substituted or unsubstituted C6 to C10 arylene group, or a substituted or unsubstituted C1 to C10 heteroarylene group.

$R^3$ may be or may include, e.g., a substituted or unsubstituted C1 to C10 alkyl group, a substituted or unsubstituted C1 to C10 heteroalkyl group, a substituted or unsubstituted C3 to C10 cycloalkyl group, a substituted or unsubstituted C2 to C10 heterocycloalkyl group, a substituted or unsubstituted C6 to C10 aryl group, or a substituted or unsubstituted C1 to C10 heteroaryl group, and k, l, m, n, o, p, and q may each independently be, e.g., an integer of 0 to 10.

In the resist underlayer composition according to an embodiment, the thiol group (—SH) of the isocyanurate compound may react with other compounds such that the isocyanurate compound may be bound to other compounds or may provide or facilitate polymerization, e.g., homopolymerization, of isocyanurate compounds. For example, a layer prepared from the resist underlayer composition may realize a high refractive index and have a fast etch rate due to the polymer including sulfur (S) in the main chain.

In an implementation, the polymer of the resist underlayer composition may have improved solubility and may form a resist underlayer having improved coating uniformity. When the polymer is used as or in a material for a resist underlayer, a uniform thin layer may not only be obtained without forming a pin-hole or a void and deteriorating a thickness distribution during a baking process, but improved gap-fill and planarization characteristics may also be obtained when a lower substrate (or a layer) has a step or is patterned.

In addition, the resist underlayer composition according to an embodiment may have excellent optical characteristics, and accordingly, a resist underlayer formed therefrom may reflect exposed light and minimize its entrance into the lower surface of a photoresist during patterning of the photoresist. In addition, the resist underlayer prepared using the composition according to an embodiment may optimize a resolution of the photoresist and improve a process yield.

High density and integration of a semiconductor pattern may proceed in accordance with development of a semiconductor industry, and accordingly, an interval among patterns becomes narrow and optical characteristics may be important during a patterning process by using photolithography. If there were to be a diffused reflection during the exposure, a pattern profile may show a defect and the like, and accordingly, in order to prevent this, an anti-reflection layer may be formed on the lower layer of the photoresist.

Some anti-reflection layers may have an inappropriate refractive index or extinction coefficient in relation to the photoresist and thus could cause the diffused reflection. In addition, some anti-reflection layers may have insufficient chemical resistance and thus may be damaged by a solvent used for coating the photoresist, a photoresist developing solution, and the like. Furthermore, some anti-reflection layers may not be etched well by and etching gas, and an overall etch rate thereof could be deteriorated. In addition, when formed as some thin layers having a thickness of less than or equal to about 100 nanometers in accordance with a recent tendency of forming an ultra-thin layer pattern, coating uniformity of the thin layer may not be obtained.

When resist underlayer composition according to an embodiment is formed into a resist lower layer, the resist lower layer may have a high refractive index and a low extinction coefficient with respect to the light used for photolithography (e.g., about 193 nm of an ArF excimer laser) and thus may help minimize diffused reflection of the exposed light and the like.

In addition, the resist underlayer composition according to an embodiment may include the polymer including the aforementioned structural unit, and thus may be coated to have a relatively uniform thickness and may have desirable insolubility with respect to various solvents used in a semiconductor process.

In addition, the resist underlayer composition according to an embodiment may be used to form an ultra-thin layer having a thickness of less than or equal to about 100 nanometers and may be etched faster by etching gas than the photoresist and thus exhibit an excellent etch rate. Accordingly, the resist underlayer composition according to an embodiment may be applied to a case using high etching characteristics, e.g., ArF, ArF-i, and EUV (Extreme Ultraviolet) lithography processes having a low etching rate, a small aspect ratio of a pattern, and the like. The EUV lithography process uses light at a wavelength of about 10 nm to about 20 nm, e.g., a very short wavelength of about 13.5 nm, and thus may form an ultra-fine pattern having a width of less than or equal to about 20 nm and may form an ultrafine pattern.

In an implementation, the polymer may have a weight average molecular weight of about 1,000 to about 100,000.

In an implementation, the polymer may have a weight average molecular weight of, e.g., about 1,000 to about 50,000, or about 1,000 to about 20,000. When the polymer has a weight average molecular weight within the ranges, the amount of carbon and solubility in a solvent of the resist underlayer composition including the polymer may be optimized.

The solvent may be a suitable one having sufficient soluble property for the polymer and may include, e.g., propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyl lactate, gamma-butyrolactone, N,N-dimethyl formamide, N,N-dimethyl acetamide, methylpyrrolidone, methylpyrrolidinone, acetylacetone, or ethyl 3-ethoxypropionate.

The polymer may be included in the composition in an amount of, e.g., about 0.1 wt % to about 30 wt %, about 0.1 wt % to about 20 wt %, or about 0.1 wt % to about 10 wt % based on a total amount of the resist underlayer composition. Within the ranges, a thickness, a surface roughness, and a planarization degree of a resist underlayer may be controlled.

In an implementation, the resist underlayer composition may further include at least one other polymer, e.g., an acryl resin, an epoxy resin, a novolac resin, a glycoluril resin, or a melamine resin, in addition to the polymer including the structural unit that is a reaction product of the compound of Chemical Formula 1 (e.g., as a polymer mixture or blend).

For example, the resist underlayer composition may further include at least one other polymer of an acryl resin, an epoxy resin, a novolac resin, a glycoluril resin, or a melamine resin in addition to the polymer including the structural units represented by Chemical Formula 3 to Chemical Formula 6.

The resist underlayer composition may further include an additive of, e.g., a surfactant, a thermal acid generator, a plasticizer, or a combination thereof.

In an implementation, the surfactant may include e.g., an alkylbenzene sulfonate salt, an alkylpyridinium salt, polyethylene glycol, a quaternary ammonium salt, or the like.

In an implementation, the thermal acid generator may include, e.g., an acidic compound such as p-toluene sulfonic acid, trifluoromethane sulfonic acid, pyridinium p-toluene sulfonic acid, salicylic acid, sulfosalicylic acid, citric acid, benzoic acid, hydroxybenzoic acid, naphthalene carbonic acid, and the like or/and 2,4,4,6-tetrabromocyclohexadienone, benzointosylate, 2-nitrobenzyltosylate, other organic sulfonic acid alkylester, or the like.

The additive may be included in an amount of about 0.001 to about 40 parts by weight based on 100 parts by weight of the resist underlayer composition. Within the ranges, solubility may be improved while optical properties of the resist underlayer composition are not changed.

In an implementation, a resist underlayer manufactured using the resist underlayer composition may be provided. The resist underlayer may be obtained by coating the resist underlayer composition on, e.g., a substrate and then curing it through a heat treatment process. The resist underlayer may be, e.g., an anti-reflection layer.

Hereinafter, a method of forming patterns using the resist underlayer composition is described referring to FIGS. 1 to 5.

FIGS. 1 to 5 illustrate cross-sectional views of stages in a method of forming patterns using a resist underlayer composition according to an embodiment.

Referring to FIG. 1, a subject for etching may be prepared. The etching subject may be a thin layer 102 formed on a semiconductor substrate 100. Hereinafter, the etching subject is the thin layer 102. An entire surface of the thin layer 102 may be washed to remove impurities and the like thereon. The thin layer 102 may be, e.g., a silicon nitride layer, a polysilicon layer, or a silicon oxide layer.

Then, a composition may be coated on the thin layer 102 and the coated composition may be dried and baked to form a resist underlayer 104 on the thin layer 102. The baking may be performed at about 100° C. to about 500° C., e.g., about 100° C. to about 300° C. The resist underlayer composition may be the composition according to an embodiment described above.

Figure 2:
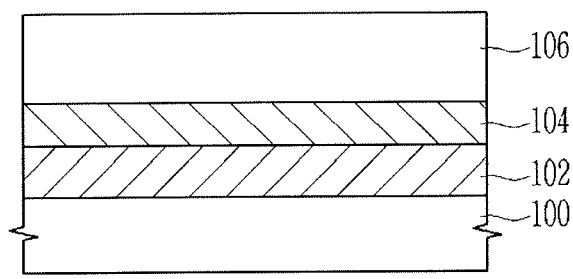

Referring to FIG. 2, a photoresist layer 106 may be formed by coating a photoresist on the resist underlayer 104.

Examples of the photoresist may include a chemically-amplified positive photoresist containing an acid generator capable of dissociating acid through exposure, a compound decomposed under a presence of the acid and having increased soluble property in an alkali aqueous solution, and an alkali-soluble resin, a chemically-amplified positive-type photoresist containing an alkali-soluble resin capable of applying a resin increasing soluble property in an alkali aqueous solution, and the like.

Subsequently, the substrate 100 (having the photoresist layer 106 thereon) may be primarily baked. The primary baking may be performed at about 90° C. to about 120° C.

Figure 3:
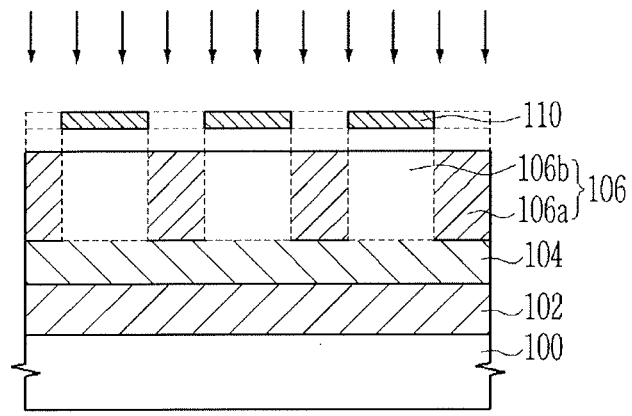

Referring to FIG. 3, the photoresist layer 106 may be selectively exposed.

Exposure of the photoresist layer 106 may be, e.g., performed by positioning an exposure mask having a predetermined pattern on a mask stage of an exposure apparatus and aligning the exposure mask 110 on the photoresist layer 106. Subsequently, a predetermined region of the photoresist layer 106 on the substrate 100 may selectively react with light passing the exposure mask by radiating light into the exposure mask 110.

Examples of the light used during the exposure may include light having a short wavelength of an activated radiation i-line having a wavelength of 365 nm, KrF excimer laser having a wavelength of 248 nm, ArF excimer laser having a wavelength of 193 nm, and the like and may be light having high energy wavelength of EUV (extreme ultraviolet; wavelength of 13.5 nm), E-Beam (electron beam), and the like.

An exposed region 106a of the photoresist layer 106 may be relatively hydrophilic compared with a non-exposed region 106b of the photoresist layer 106. Accordingly, the exposed region 106a and non-exposed region 106b of the photoresist layer 106 may have different solubilities relative each other.

Subsequently, the substrate 100 may be secondarily baked. The secondary baking may be performed at about 90° C. to about 150° C. The non-exposed region 106b of the photoresist layer may become easily soluble in a predetermined solvent (e.g., developing solution) due to the secondary baking.

Figure 4:
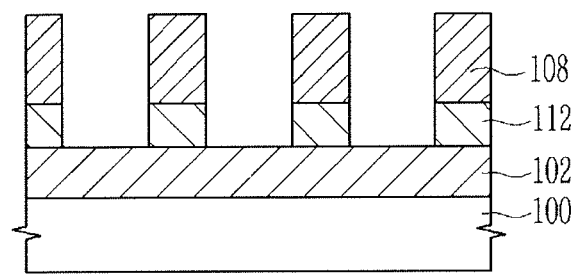

Referring to FIG. 4, the non-exposed region 106b of the photoresist layer may be dissolved and removed by a developing solution to form a photoresist pattern 108. Specifically, the non-exposed region 106b of the photoresist layer may be dissolved and removed by using a developing solution such as tetra-methyl ammonium hydroxide (TMAH) or the like to finish the photoresist pattern 108.

Subsequently, the photoresist pattern 108 may be used as an etching mask to etch the resist underlayer. Through the etching, an organic layer pattern 112 may be formed. The etching may be, e.g., dry etching using etching gas, and the etching gas may be, e.g., $CHF_3$, $CF_4$, $Cl_2$, $BCl_3$, or a mixed gas thereof. As described above, a resist underlayer formed from the resist underlayer composition according to an embodiment may have a fast etch rate, and an etching process may be smoothly performed in a short time.

Figure 5:
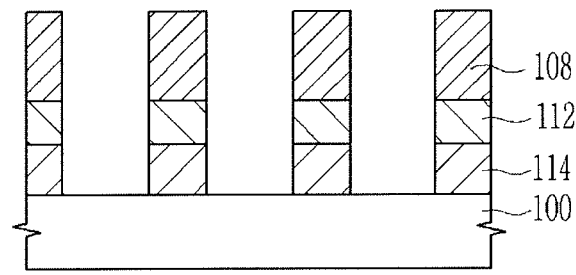

Referring to FIG. 5, the photoresist pattern 108 may be applied as an etching mask to etch the exposed thin layer 102. As a result, the thin layer may be formed into a thin layer pattern 114. During the exposure process, the thin layer pattern 114 formed by an exposure process using a light source having of a short wavelength such as activated radiation i-line (365 nm), KrF excimer laser (wavelength of 248 nm), ArF excimer laser (wavelength of 193 nm) and the like may have a width of scores of nanometers to hundreds of nanometers, and the thin layer pattern 114 formed by an exposure process using an EUV light source may have a width of less than or equal to about 20 nm.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLES

Synthesis Example 1

30 g of 1-(2-hydroxyethyl)-3,5-bis(3-mercaptopropyl)-1,3,5-triazinane-2,4,6-trione, 22.92 g of 1,4-cyclohexanedimethanol divinyl ether, 0.389 g of AIBN, and 150 g of dimethyl formamide (DMF) were put in a 500 ml 2-necked round flask, and a condenser was connected thereto. A temperature thereof was increased up to 80° C., and after a reaction for 2.5 hours, the reaction solution was cooled down to ambient temperature. Subsequently, the reaction solution was moved to a 1 L wide mouth bottle, washed three times with hexane, and subsequently washed with diethyl ether and purified water. A resin in a gum state obtained therefrom was completely dissolved in 80 g of THF and then, slowly added in a dropwise fashion to 700 g of toluene while stirring. After pouring a solvent away therefrom, a solvent still remaining there was removed with a vacuum pump to obtain a polymer including a structural unit represented by Chemical Formula 3A (Mw=6,300).

Synthesis Example 2

30 g of 1-(2-hydroxyethyl)-3,5-bis(3-mercaptopropyl)-1,3,5-triazinane-2,4,6-trione, 11.45 g of allyl ether, 0.326 g of AIBN, and 120 g of DMF were put in a 500 ml 2-necked round flask, and a condenser was connected thereto. A temperature thereof was increased up to 80° C., and after a reaction for 2.5 hours, the reaction solution was cooled down to ambient temperature. Subsequently, the reaction solution was moved to a 1 L wide mouth bottle, washed three times with hexane, and subsequently washed with purified water. A resin in a gum state obtained therefrom was completely dissolved in 80 g of THF and then, slowly added in a dropwise fashion to 700 g of toluene while stirring. After pouring a solvent away therefrom, a solvent still remaining there was removed with a vacuum pump to obtain a polymer including a structural unit represented by Chemical Formula 4A (Mw=5,800).

[Chemical Formula 4A]

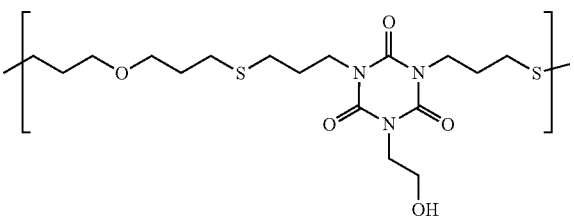

Synthesis Example 3

30 g of 1-(2-hydroxyethyl)-3,5-bis(3-mercaptopropyl)-1,3,5-triazinane-2,4,6-trione, 10.65 g of 1,5-hexadiene diepoxide, and 10 g of triethyl amine were put in a 500 ml 2-necked round flask, and a condenser was connected thereto. A temperature thereof was increased up to 60° C., and after a reaction for 2 hours, the reaction solution was cooled down to ambient temperature. Subsequently, the reaction solution was moved to a 1 L wide mouth bottle, washed three times with hexane, and subsequently washed with purified water. A resin in a gum state obtained therefrom was completely dissolved in 80 g of THF and then, slowly added in a dropwise fashion to 700 g of hexane while stirring. After pouring a solvent away therefrom, a solvent still remaining there was removed with a vacuum pump to obtain a polymer including a structural unit represented by Chemical Formula 5A (Mw=4,800).

[Chemical Formula 3A]

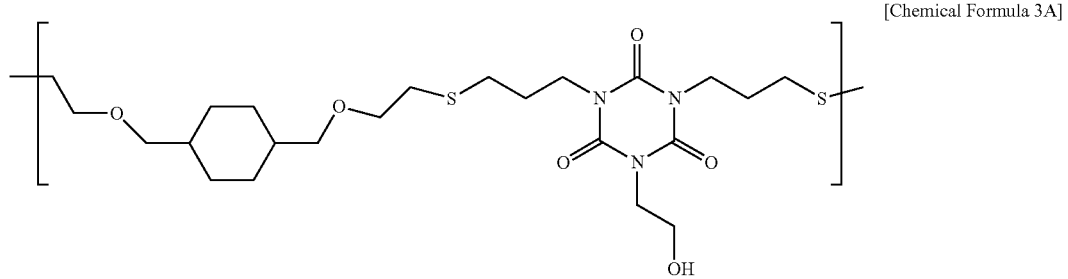

[Chemical Formula 5A]

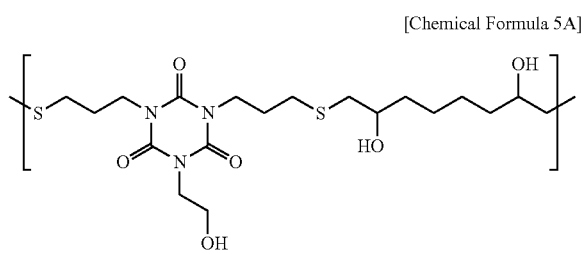

[Chemical Formula 7A]

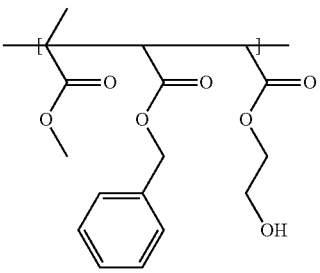

Synthesis Example 4

30 g of 1-(2-hydroxyethyl)-3,5-bis(3-mercaptopropyl)-1,3,5-triazinane-2,4,6-trione and 15.91 g of succinyl chloride were put in a 500 ml 2-necked round flask, and 13.85 g of triethyl amine was added thereto in a dropwise fashion, while stirring at ambient temperature. After a reaction for 2.5 hours, the reaction solution was cooled down to ambient temperature. Subsequently, the reaction solution was moved to a 1 L wide-mouthed bottle, neutralized with potassium carbonate, and then, washed three times with hexane and subsequently, with purified water. A resin in a gum state obtained therefrom was completely dissolved in 80 g of THF and then, slowly added in a dropwise fashion to 700 g of toluene while stirred. After pouring a solvent away therefrom, a solvent still remaining there was removed with a vacuum pump to obtain a polymer including a structural unit represented by Chemical Formula 6A (Mw=2,200).

[Chemical Formula 6A]

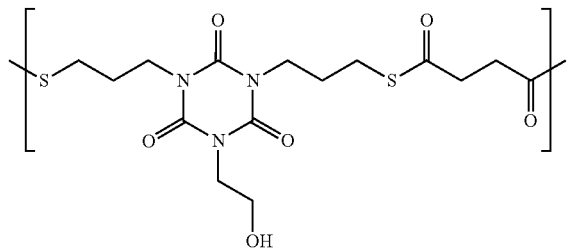

COMPARATIVE SYNTHESIS EXAMPLE 40 g of methyl methacrylate, 52.1 g of 2-hydroxyethylacrylate, 70.4 g of benzyl acrylate, 2 g of AIBN, and 306 g of dioxane were put in a 500 ml 2-necked round flask, and a condenser was connected thereto. A temperature thereof was increased up to 80° C., and after a reaction for 2.5 hours, the reaction solution was cooled down to ambient temperature. The reaction solution was moved to a 3 L wide-mouth bottle and then, washed with hexane. The obtained resin was dried in a 30° C. vacuum oven to remove the residual solvent to obtain a polymer including a structural unit represented by Chemical Formula 7A (Mw=12,000).

Preparation of Resist Underlayer Composition

Example 1

The polymer prepared in Synthesis Example 1, PD1174 (TCI Inc.; hardener) (15 parts by weight relative to 100 parts by weight of the polymer) and pyridinium p-toluene sulfonate (1 part by weight relative to 100 parts by weight of the polymer) was dissolved in a mixed solvent of propylene glycol monomethylether and ethyl lactate (in a weight ratio=1:1) and then, stirred for 6 hours to prepare a resist underlayer composition.

The mixed solvent was used in an amount of 1 wt % based on a total amount of the resist underlayer composition for preparing the polymer solid content.

Examples 2 to 4

Resist underlayer compositions were prepared according to the same method as Example 1 by respectively using the polymers according to Synthesis Examples 2 to 4 instead of the polymer prepared in Synthesis Example 1.

COMPARATIVE EXAMPLE

A resist underlayer composition was prepared according to the same method as Example 1 except that the polymer of the Comparative Synthesis Example was used instead of the polymer of Synthesis Example 1.

Evaluation of Optical Properties 2 ml samples of the compositions of Examples 1 to 4 and Comparative Example were respectively taken and applied on a 4-inch wafer, and then, spin-coated at 1,500 rpm for 20 seconds by using a spin coater (Mikasa Co., Ltd.) and cured at 210° C. for 90 seconds to form 60 nm-thick thin layers.

A refractive index (n) and an extinction coefficient (k) of each thin layer were measured under a condition of 800 Å by using a VASE Elliposmeter (J. A. Woollam Co.), and the results are shown in Table 1.

TABLE 1

| | Refractive index (n) | Extinction coefficient (k) |
|---|---|---|
| Example 1 | 2.01 | 0.35 |
| Example 2 | 1.95 | 0.28 |
| Example 3 | 1.94 | 0.32 |
| Example 4 | 1.95 | 0.29 |
| Comparative Example | 1.84 | 0.28 |

As may be seen in Table 1, the thin layers of Examples 1 to 4 exhibited a higher refractive index than that of the Comparative Example.

Evaluation of Etch Rate 2 ml samples of compositions of Examples 1 to 4 and Comparative Example were respectively taken and applied on a 12-inch wafer, and then, spin-coated at 1,500 rpm for 20 seconds by using a 12" WF track (SVS Co., Ltd, MSX3000). Subsequently, the coated compositions were cured at 205° C. for 60 seconds to form resist underlayers. The formed resist underlayers were respectively etched under $CF_4$, $CHF_3$, and $O_2$ gases for 20 seconds, and then, the etched thicknesses were measured to calculate each etch rate, and the results are shown in Table 2.

In Table 2, each relative ratio of the etch rates of the Examples was calculated by using the etch rate of the Comparative Example as a reference of 1.0, and the results are shown.

TABLE 2

|  | Etch rate |
|---|---|
| Example 1 | 1.21 |
| Example 2 | 1.23 |
| Example 3 | 1.24 |
| Example 4 | 1.28 |
| Comparative Example | 1.0 |

As may be seen in Table 2, the resist underlayers of Examples 1 to 4 exhibited remarkably improved etch rates compared with the Comparative Example.

By way of summation and review, exposure performed during formation of the photoresist pattern may be a factor for obtaining a photoresist image with a high resolution.

The exposure of a photoresist may be performed by using an activated radiation, which could be reflected and restrict resolution of an image patterned in the photoresist layer. For example, if the radiation were to be reflected on or at an interface between the substrate and the photoresist layer or on an interlayer hardmask and scattered into a photoresist region, a photoresist line width could become non-uniform and pattern-formability could be obstructed.

A photoresist underlayer composition should absorb the reflected radiation and simultaneously, have high etch selectivity with respect to the photoresist, and may have chemical resistance against a solvent used in a subsequent process after thermal curing and excellent adherence to the photoresist to help patterning the photoresist.

In order to decrease the reflected radiation, an attempt to absorb light passing the photoresist and simultaneously improve etch selectivity, chemical resistance, and adherence to the photoresist may include disposing an organic layer, e.g., a resist underlayer, between a substrate and a photoresist layer.

For example, as a semiconductor pattern gradually becomes fine, use of an activated radiation used for an exposure of a photoresist may be widened up to a short wavelength such as i-line (about 365 nm), a KrF excimer laser (a wavelength of 248 nm), an ArF excimer laser (a wavelength of about 193 nm), and the like, and accordingly, a desirable resist underlayer may be used for a patterning process for forming an ultra-fine pattern of about 10 nm by using an EUV (Extreme Ultraviolet) light source.

One or more embodiments may provide a resist underlayer composition capable of improving pattern-formability due to improved coating uniformity, optical properties, and etch rates.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A resist underlayer composition, comprising:
a polymer including a structural unit that is a reaction product of an isocyanurate compound and a compound having at least one reactive functional group, and
a solvent,
wherein:
the isocyanurate compound is represented by Chemical Formula 1:

[Chemical Formula 1]

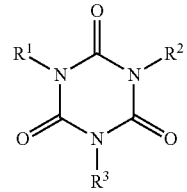

in Chemical Formula 1, $R^1$ to $R^3$ are each independently a substituted or unsubstituted C1 to C30 alkyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C6 to C30 aryl group, or a substituted or unsubstituted C1 to C30 heteroaryl group, provided that at least one of $R^1$ to $R^3$ includes a thiol group substituent, the compound having at least one reactive functional group is represented by one of the following Chemical Formula 2-1 to Chemical Formula 2-4:

[Chemical Formula 2-1]

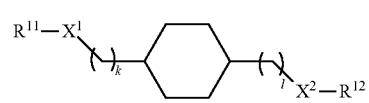

[Chemical Formula 2-2]

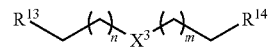

[Chemical Formula 2-3]

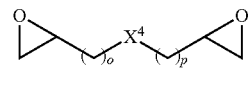

[Chemical Formula 2-4]

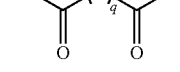

in Chemical Formulae 2-1 to 2-4,
$X^1$ to $X^4$ are each independently $CH_2$, O, or S,
$R^{11}$ to $R^{14}$ are each independently a substituted or unsubstituted C1 to C6 alkenyl group, $R^{15}$ and $R^{16}$ are each independently hydrogen or a halogen atom, and k, l, m, n, o, p, and q are each independently an integer of 0 to 10.

2. The resist underlayer composition as claimed in claim 1, wherein the isocyanurate compound represented by Chemical Formula 1 is represented by Chemical Formula 1-1:

[Chemical Formula 1-1]

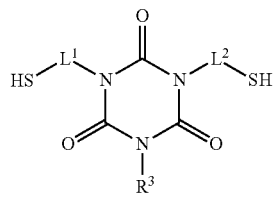

wherein, in Chemical Formula 1-1, $L^1$ and $L^2$ are each independently a substituted or unsubstituted C1 to C10 alkylene group, a substituted or unsubstituted C1 to C10 heteroalkylene group, a substituted or unsubstituted C3 to C10 cycloalkylene group, a substituted or unsubstituted C2 to C10 heterocycloalkylene group, a substituted or unsubstituted C6 to C10 arylene group, or a substituted or unsubstituted C1 to C10 heteroarylene group, and $R^3$ is a substituted or unsubstituted C1 to C10 alkyl group, a substituted or unsubstituted C1 to C10 heteroalkyl group, a substituted or unsubstituted C3 to C10 cycloalkyl group, a substituted or unsubstituted C2 to C10 heterocycloalkyl group, a substituted or unsubstituted C6 to C10 aryl group, or a substituted or unsubstituted C1 to C10 heteroaryl group.

3. The resist underlayer composition as claimed in claim 1, wherein the structural unit of the polymer is represented by one of the following Chemical Formula 3 to Chemical Formula 6:

[Chemical Formula 3]

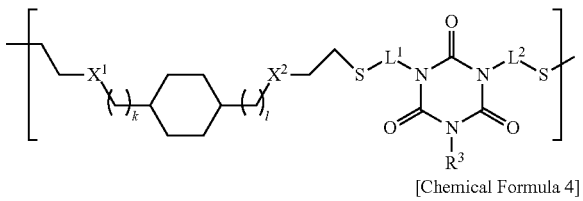

[Chemical Formula 4]

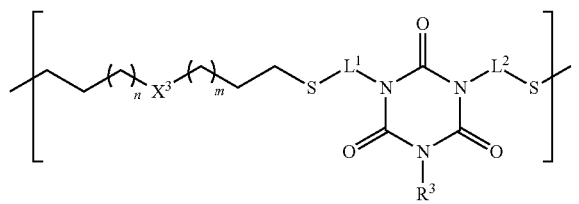

[Chemical Formula 5]

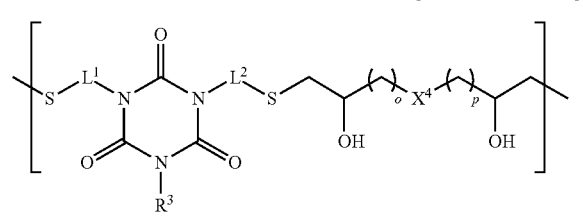

[Chemical Formula 6]

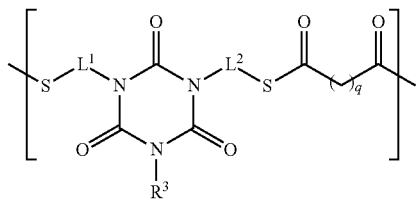

wherein, in Chemical Formula 3 to Chemical Formula 6, $X^1$ to $X^4$ are each independently $CH_2$, O, or S, $L^1$ and $L^2$ are each independently a substituted or unsubstituted C1 to C10 alkylene group, a substituted or unsubstituted C1 to C10 heteroalkylene group, a substituted or unsubstituted C3 to C10 cycloalkylene group, a substituted or unsubstituted C2 to C10 heterocycloalkylene group, a substituted or unsubstituted C6 to C10 arylene group, or a substituted or unsubstituted C1 to C10 heteroarylene group, $R^3$ is a substituted or unsubstituted C1 to C10 alkyl group, a substituted or unsubstituted C1 to C10 heteroalkyl group, a substituted or unsubstituted C3 to C10 cycloalkyl group, a substituted or unsubstituted C2 to C10 heterocycloalkyl group, a substituted or unsubstituted C6 to C10 aryl group, or a substituted or unsubstituted C1 to C10 heteroaryl group, and k, l, m, n, o, p, and q are each independently an integer of 0 to 10.

4. The resist underlayer composition as claimed in claim 1, wherein the polymer has a weight average molecular weight of about 1,000 to about 100,000.

5. The resist underlayer composition as claimed in claim 1, wherein the polymer is included in the composition in an amount of about 0.1 wt % to about 30 wt %, based on a total weight of the resist underlayer composition.

6. The resist underlayer composition as claimed in claim 1, further comprising an additional polymer, the additional polymer including an acryl resin, an epoxy resin, a novolac resin, a glycoluril resin, or a melamine resin.

7. The resist underlayer composition as claimed in claim 1, further comprising a surfactant, thermal acid generator, a plasticizer, or a combination thereof.

8. A method of forming patterns, the method comprising:
forming an etching subject layer on a substrate,
coating the resist underlayer composition as claimed in claim 1 on the etching subject layer to form a resist underlayer,
forming a photoresist pattern on the resist underlayer, and
sequentially etching the resist underlayer and the etching subject layer using the photoresist pattern as an etching mask.

9. The method as claimed in claim 8, wherein forming the photoresist pattern includes:
forming a photoresist layer on the resist underlayer,
exposing the photoresist layer, and
developing the photoresist layer.

10. The method as claimed in claim 9, wherein forming the resist underlayer further includes heat-treating the coated resist underlayer composition at a temperature of about 100° C. to about 500° C.

11. The resist underlayer composition as claimed in claim 1, wherein the polymer has a weight average molecular weight of 2,200 to 100,000.

* * * * *